(12) United States Patent
Spevak

(10) Patent No.: US 10,275,090 B2
(45) Date of Patent: Apr. 30, 2019

(54) METHOD AND APPARATUS FOR GHOSTING SUPPRESSION IN CAPACITIVE KEY MATRIX AND TOUCH PADS

(71) Applicant: Texas Instruments Incorporated, Dallas, TX (US)

(72) Inventor: Peter Spevak, Moosburg a.d. Isar (DE)

(73) Assignee: Texas Instruments Incorporated, Dallas, TX (US)

( * ) Notice: Subject to any disclaimer, the term of this patent is extended or adjusted under 35 U.S.C. 154(b) by 47 days.

(21) Appl. No.: 15/242,233

(22) Filed: Aug. 19, 2016

(65) Prior Publication Data

US 2017/0115822 A1 Apr. 27, 2017

Related U.S. Application Data

(60) Provisional application No. 62/244,235, filed on Oct. 21, 2015.

(51) Int. Cl.
*G06F 3/044* (2006.01)
*G06F 3/041* (2006.01)
(Continued)

(52) U.S. Cl.
CPC ............ *G06F 3/0418* (2013.01); *G06F 3/044* (2013.01); *G06F 3/0416* (2013.01);
(Continued)

(58) Field of Classification Search
CPC ...... G06F 3/0418; G06F 3/0416; G06F 3/044; G06F 2203/04111; G06F 2203/04104; H03K 17/9622; H03M 11/003
See application file for complete search history.

(56) References Cited

U.S. PATENT DOCUMENTS

2008/0150906 A1* 6/2008 Grivna ................. G06F 3/0416
345/173
2010/0007631 A1* 1/2010 Chang .................... G06F 3/044
345/174
(Continued)

OTHER PUBLICATIONS

MSP430FR263x, MSP430FR253x Mixed-Signal Microcontrollers, Texas Instruments Data Sheet, SLAS942—Nov. 2015—Revised Dec. 2015, pp. 1-102, accessed, Aug. 19, 2016, http://www.ti.com/lit/ds/symlink/msp430fr2533.pdf.
(Continued)

*Primary Examiner* — Ibrahim A Khan
(74) *Attorney, Agent, or Firm* — Michelle F. Murray; Charles A. Brill; Frank D. Cimino

(57) ABSTRACT

An apparatus includes a plurality of capacitive sensors arranged in a matrix on a substrate. A measuring circuitry measures the capacitance of each of a plurality of row lines and a plurality of column lines in the matrix coupled to the capacitive sensors. A first electrode is on the substrate on a first edge of the matrix and is proximal to a first corner of the matrix. The first electrode is coupled to the measuring circuitry. A second electrode is on the substrate on the first edge of the matrix and is proximal to a second corner of the matrix, the second corner opposing the first corner on the first edge. The second electrode is coupled to the measuring circuitry. The measuring circuitry determines the positions of two touches to the touch pad. Methods are disclosed.

20 Claims, 7 Drawing Sheets

(51) Int. Cl.
*H03K 17/96* (2006.01)
*H03M 11/00* (2006.01)

(52) U.S. Cl.
CPC .............. *G06F 2203/04104* (2013.01); *G06F 2203/04111* (2013.01); *H03K 17/9622* (2013.01); *H03M 11/003* (2013.01)

(56) References Cited

U.S. PATENT DOCUMENTS

| | | | | |
|---|---|---|---|---|
| 2011/0157066 A1* | 6/2011 | Waterbury | ............ | G06F 3/0416 345/174 |
| 2012/0120006 A1* | 5/2012 | Liu | ............ | G06F 3/044 345/173 |
| 2012/0306802 A1* | 12/2012 | McCracken | ............ | G06F 3/0416 345/174 |
| 2013/0062182 A1* | 3/2013 | Tokura | ............ | H03K 17/962 200/600 |
| 2014/0091815 A1* | 4/2014 | Suwald | ............ | G01R 27/2605 324/658 |
| 2014/0168159 A1* | 6/2014 | Li | ............ | G06F 3/0416 345/174 |
| 2016/0162068 A1* | 6/2016 | Monney | ............ | G06F 3/017 345/174 |
| 2016/0349869 A1* | 12/2016 | Chang | ............ | G06F 3/044 |
| 2016/0349870 A1* | 12/2016 | Chang | ............ | G06F 3/0418 |
| 2016/0364060 A1* | 12/2016 | Wang | ............ | G02F 1/1333 |

OTHER PUBLICATIONS

MSP430FR4xx and MSP430FR2xx Family, Texas Instruments User's Guide, Literature No. SLAU445F, Oct. 2014, Revised Mar. 2016, pp. 1-661, accessed Aug. 19, 2016, http://www.ti.com/lit/ug/slau445g/slau445g.pdf.

Proximity Sensing of up to 30-cm Range With >15-dB SNR and Robust Capacitive Touch Reference Design, Texas Instruments Technical Document, May 2016, accessed Aug. 19, 2016, http://www.ti.com/lit/ug/tiduau2b/tiduau2b.pdf.

\* cited by examiner

METHOD AND APPARATUS FOR GHOSTING SUPPRESSION IN CAPACITIVE KEY MATRIX AND TOUCH PADS

CROSS-REFERENCE TO RELATED APPLICATIONS

This application claims the benefit of priority under 35 U.S.C. § 119(e) to co-owned U.S. Provisional Patent Application Ser. No. 62/244,235, filed Oct. 21, 2015, entitled "Ghosting Suppression for Capacitive Key Matrix and Touch Pad," naming Peter Spevak as inventor, which is hereby incorporated by reference in its entirety herein.

TECHNICAL FIELD

This application relates generally to capacitive touch input devices, and in particular to eliminating ghosting in capacitive touch input devices.

BACKGROUND

Capacitive touch input devices have proven to be useful in a variety of environments. In a simple configuration, a sensor is a capacitor. In a self-capacitance sensor, a sensor forms a first plate of a capacitor. An electric field forms around the sensor. A user's finger disturbs the electric field as it approaches the sensor. A non-conductive overlay can protect the sensors. As a user's finger approaches the sensor, a change in the capacitance value is detected. In a mutual capacitance sensor, a pair of sensors are in close proximity on a surface to form a capacitor. An electric field forms between the two sensors. As a user's finger approaches the mutual capacitance sensor, the electric field changes and the change can be detected.

In devices that have simple input needs, a matrix of capacitive touch sensors in a panel can provide a good solution. Appliances and toys are examples of devices that may require simple, inexpensive sensors. In another application, remote controls for devices including televisions, audio systems, video players, and cable boxes that use a wireless interface such as Bluetooth, WiFi, infrared, or RF can use touch sensors as inputs. In this type of device, simple scanning of the sensors provides an inexpensive and reliable method of capacitive sensor operation. In this configuration, the sensors connect to access lines in rows and columns. In a detection mode, a scan is made of each row line and each column line to determine the capacitance for each line. This type of scanning can detect a single touch by detecting a change in capacitance. The scanning can be continuous or can activate after a time period elapses, or the scanning can be triggered by some other event such as a motion detector or proximity detector that indicates activity.

It would be desirable to provide for additional input options by allowing touching two different locations on a touch area at one time. In an example where the touch area includes a simple button pattern, each sensor may correspond to a single button. In some examples, the sensors tend to be much smaller than a fingertip and the user "touches" several sensors with a single touch. In either case, the use of a two finger touch is desirable. The ability to detect a two finger touch increases input options without increasing the number of sensors. However, in prior known approaches using row line and column line scanning, when two touches are made to diagonally opposed locations in a capacitive touch matrix, it is not possible to distinguish between the two diagonally opposed options (e.g., top-right and bottom-left vs. top left and bottom right). This problem is called "ghosting." Ghosting means that when multiple touches are made to two areas in two columns and/or two rows in the matrix, the independent row and column scan approach cannot choose between at least two equally likely solutions. In devices that include additional controller processing power (e.g., cell phones and tablets) and that have more complex touch sensors include the capability to drive a transmit electrode and monitor a separate receive electrode for a single measurement, this advanced hardware and software approach can eliminate ghosting. However, for less expensive devices that do not have these costly arrangements and higher processing power, ghosting remains a problem that needs to be addressed.

SUMMARY

In accordance with an example embodiment, a capacitive touch pad includes a plurality of capacitive sensors arranged in a matrix on a substrate. A measuring circuitry measures the capacitance of each of a plurality of row lines and a plurality of column lines in the matrix coupled to the capacitive sensors. At least two additional electrodes are used. A first electrode is on the substrate on a first edge of the matrix and is proximal to a first corner of the matrix. The first electrode is coupled to the measuring circuitry. A second electrode is on the substrate on the first edge of the matrix and is proximal to a second corner of the matrix, the second corner opposing the first corner on the first edge. The second electrode is coupled to the measuring circuitry. In another embodiment, a third electrode is coupled to the first electrode and is point symmetrical to the center of the plurality of capacitive sensors from the first electrode; and a fourth electrode is coupled to the second electrode and is point symmetrical to the center of the plurality of capacitive sensors from the second electrode.

DETAILED DESCRIPTION OF EXAMPLE EMBODIMENTS

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled."

Figure 1:
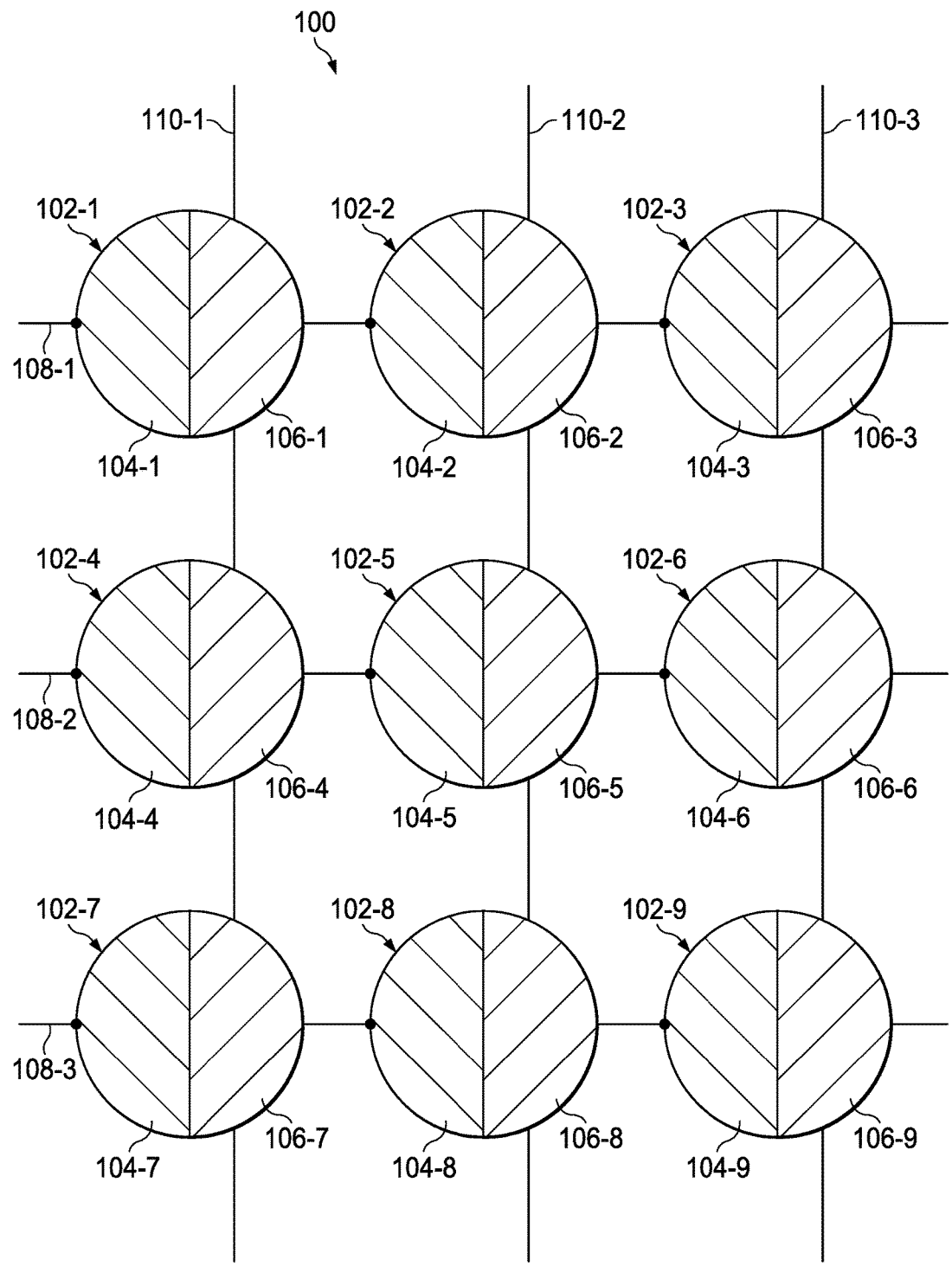
FIG. 1 is a circuit diagram showing a capacitive sensor matrix.

FIG. 1 is a circuit diagram showing a capacitive sensor matrix. Matrix 100 includes nine sensors 102-1 through 102-9 in an example three by three matrix. Each sensor 102-X includes a first plate 104-X and a second plate 106-X that are galvanically separated. Each of the first plates 104-X couples to one of row lines 108-1 through 108-3. For example, first plates 104-1 through 104-3 couple to line 108-1. Each of the second plates 106-X couples to one of column lines 110-1 through 110-3. For example, second plates 106-1, 106-4 and 106-7 couple to column line 110-1.

Touching of sensors 102-1 through 102-9 is detected by measuring the capacitance of the sensor. The touch sensors in this example use self-capacitance principles. In self-capacitance, a signal couples to one or more sensors. When no touch is present, the sensor has an electric field around it that results in a measurement. When a user's finger is placed on or near the sensor, the user's finger alters the electric field, thus altering the capacitance of the sensor. This change in capacitance can be measured. In one example of a sensing approach, the sensor electrode is coupled to a relaxation oscillator signal. The electrode builds up a field when the rows and columns are individually scanned by coupling them to the relaxation oscillation signal. For example, the electrode 104-1 is scanned when line 108-1 is driven by the relaxation oscillation signal. In FIG. 1, line 108-1 corresponds to a row line. In another example, electrode 106-1 is scanned when the line 110-1 is driven. In FIG. 1, line 110-1 corresponds to a column line. Electrodes 104-X and 106-X are arranged so that they are exposed to the user's touch. The semicircle shapes indicate that both the row electrodes such as 104-1 and the column electrodes such as 106-1 are each exposed to be affected by the proximity to a user's finger during a touch event.

In alternative embodiments, other sensing approaches can be used. For example, the sensing can use charge transfer arrangements, or can charge an electrode by coupling the lines to a constant current source in a patterned fashion. Analog to digital converters (ADC's) can be used with digital processing to determine the capacitance for each sensor and to detect changes in the capacitance corresponding to a touch at a sensor.

Figure 2:
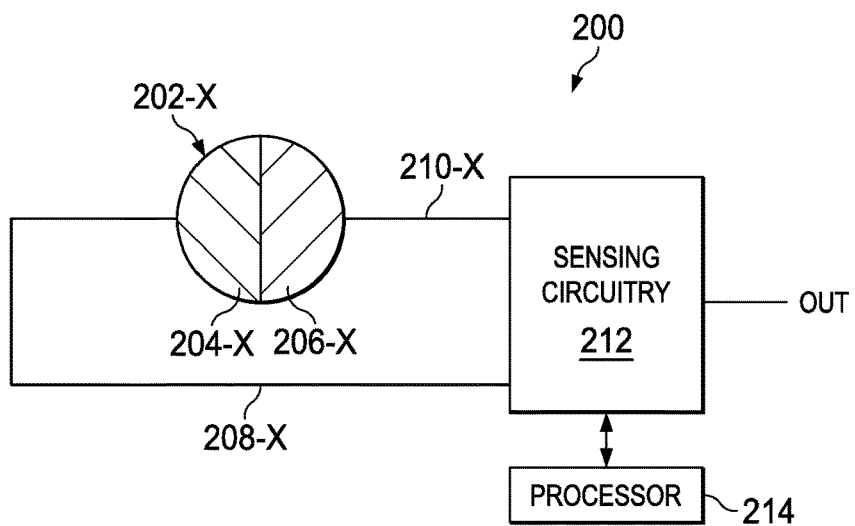
FIG. 2 is a circuit diagram showing a detection circuit for use with capacitive sensors.

FIG. 2 is a block diagram showing a capacitive touch sensor circuit 200 arranged for use with capacitive sensors. Elements in FIG. 2 that correspond to the elements in FIG. 1 have similar reference labels, for clarity. For example, sensor 202-X, plate 204-X and plate 206-X in FIG. 2 correspond to sensor 102-X, plate 104-X and plate 106-X in FIG. 1. In FIG. 2, sensor 202-X is shown having a first plate 204-X and a second plate 206-X. The first plate 204-X corresponds to sensor plates arranged on a row line and is coupled to a row sensor line. An example row line 208-X is coupled to the sensor plate 204-X. An example column line 210-X is coupled to the sensor plate 206-X. Sensing circuit 212 is coupled to the row and column lines. The sensing circuitry 212 can include analog to digital converters, current sources, relaxation oscillators, and multiplexors needed to scan through a plurality of sensors on a repetitive basis to detect changes in the capacitance of a sensor, indicating a touch. Processor 214 interprets the results of these measurements to determine which of the sensors are being touched, if any, and can execute the functions indicated by those inputs.

Figure 3:
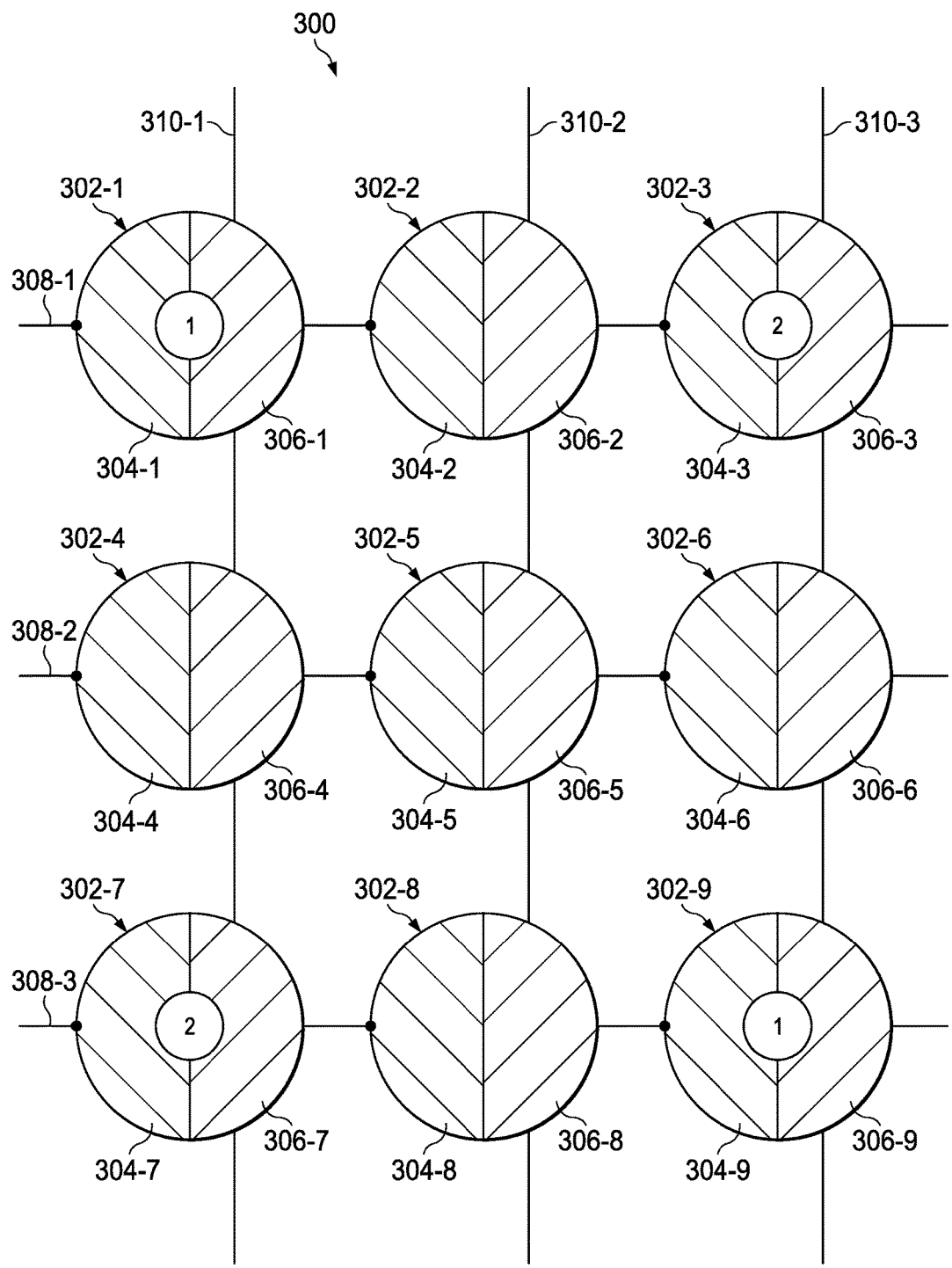
FIG. 3 is a circuit diagram of the matrix of FIG. 1 showing a ghosting problem with multi-touch.

FIG. 3 is a circuit diagram of the matrix similar to that shown in FIG. 1 illustrating the ghosting problem with multi-touch that occurs in prior known approach capacitive sensors. In FIG. 3, the reference numerals for components are similar to those for similar components shown in FIG. 1, for clarity. For example, in FIG. 3, sensor 302-1 is similar to sensor 102-1 in FIG. 1. In FIG. 3, a two finger touch is shown. The user simultaneously touches sensors 302-1 and 302-9 as indicated by the numerals "1" in FIG. 3 at these sensor locations. In a simple scanning process, the row lines 308-1 through 308-3 are scanned and each of column lines 310-1 through 310-3 are scanned. With this simple scanning process, a touch of sensors 302-1 and 302-9 is sensed on row lines 308-1 and 308-3. The touch is also sensed on column lines 310-1 and 310-3. However, the touches labeled "2" to sensors 302-3 and 302-7 would provide exactly the same column and row sensing signals. Under these circumstances, using the matrix of sensors 300 in FIG. 3 with the simple scanning approach, it is not possible to determine if the two touches indicated by the labels "1" or the two touches indicated by the labels "2" are the correct touches. That is, the scanning process cannot discriminate between two equally likely solutions to determine where the two touches occurred.

Figure 4:
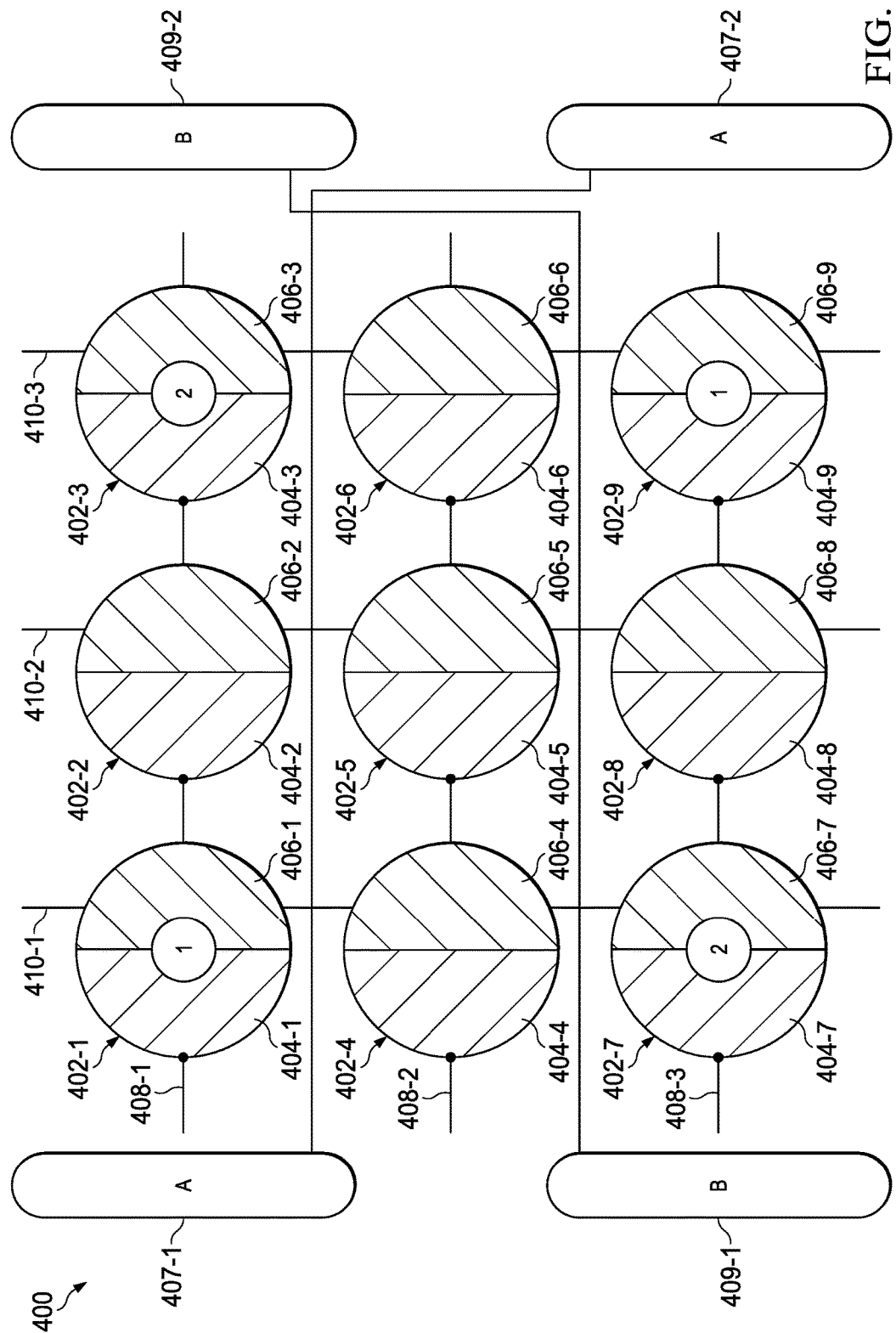
FIG. 4 is a circuit diagram of an embodiment touch sensor.

FIG. 4 is a circuit diagram of an aspect of an embodiment. In FIG. 4, the reference labels used for components that are similar to the components in FIG. 3 are similar, for clarity. For example, sensor 402-1 in FIG. 4 is similar to sensor 302-1 in FIG. 3. Matrix 400 includes sensors 402-1 through 402-9 arranged in a three by three matrix as in FIG. 3. For clarity, correct touches to sensors 402-1 and 402-9 are labeled "1" and false positive touches to sensors 402-3 and 402-7 are labeled "2." Matrix 400 also includes electrodes 407-1, 407-2, 409-1 and 409-2. Electrodes 407-1 and 407-2 are point symmetrical to the center of matrix 400. Objects are point symmetrical when every part of one object has a matching part the same distance from the central point, but in the opposite direction. Similarly, electrodes 409-1 and 409-2 are also point symmetrical to the center of matrix 400. In other embodiments, electrodes 407-1 and 407-2, and 409-1 and 409-2 are not point symmetrical, but are merely positioned at opposite corners of the matrix from its counterpart. Electrode 407-1 is positioned toward one corner of matrix 400 while electrode 409-1 is positioned toward the opposite corner on the same edge as electrode 407-1. Electrodes 407-2 and 409-2 are on the opposite edge of the matrix and flipped relative to electrodes 407-1 and 409-1. Electrodes 407-1 and 407-2 are coupled. Electrodes 409-1 and 409-2 are also coupled. In this configuration, electrodes 407-1 and 407-2 are closer to the touches to sensors 402-1 and 402-9 (labeled "1") than electrodes 409-1 and 409-2. Therefore, the capacitance observed on electrodes 407-1 and 407-2 is greater than that of electrodes 409-1 and 409-2 when touches to sensors 402-1 and 402-9 ("1") are made. Therefore, the real touches to sensors 402-1 and 402-9 ("1") can be discerned from the false or "ghost" touches to sensors 402-3 and 402-7 ("2"). Those areas are not touches in this example, so that the capacitance on electrodes 409-1 and 409-2 is affected much less by the touches, because the distance from the electrodes 409-1 and 409-2 to the touch areas is much greater. The use of the electrodes 407-1, 407-2, 409-1 and 409-2 as positioned in FIG. 4 allows the correct determination of the positions of the two touches to sensors 402-1 and 402-9 ("1").

Figure 5:
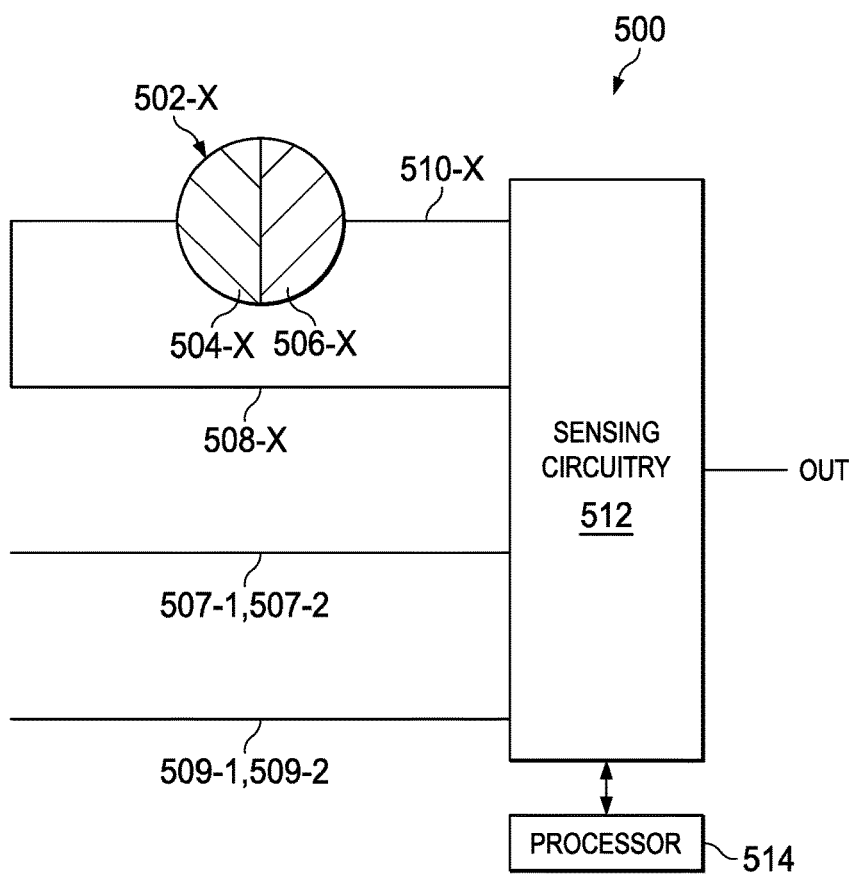
FIG. 5 is a circuit diagram of an embodiment detection circuit.

FIG. 5 is a circuit diagram of an embodiment detector circuit. Elements with similar reference labels to the elements in FIG. 4 perform corresponding functions. For example, sensor 502-X, plate 504-X and plate 506-X correspond to sensor 402-X, plate 404-X and plate 406-X in FIG. 4. In FIG. 5, sensor 502-X is shown having a first plate 504-X and a second plate 506-X. The first plate 504-X corresponds to sensor plates arranged on a row line and is coupled to a row line 508-X. An example column line 510-X is coupled to the sensor plate 506-X. Sensing circuit 512 is coupled to the row and column lines. The sensing circuitry can include analog to digital converters, current sources, relaxation oscillators, and multiplexors needed to scan through a plurality of sensors on a repetitive basis to detect changes in the capacitance of a sensor, indicating a touch. In addition to measuring the capacitance of sensors 502-X by scanning row lines 508-X and column lines 510-X, sensing circuit 512 has one lead coupled to electrodes 507-1 and 507-2 and another lead coupled to electrodes 509-1 and 509-2. Electrodes 507-1 and 507-2 correspond to electrodes 407-1 and 407-2 of FIG. 4, respectively. Electrodes 509-1 and 509-2 correspond to electrodes 409-1 and 409-2 of FIG. 4, respectively. As described above, the use of the electrodes 507-1, 507-2 and electrodes 509-1, 509-2 enables the sensing circuitry to distinguish the correct touch positions, allowing discernment between two possible solutions to the two touch locations. Processor 514 interprets the results of these measurements to determine which of the sensors are being touched, if any, and executes the functions indicated by those inputs. Because the capacitances of electrodes 507-1, 507-2, 509-1 and 509-2 are measured by sensing circuit 512, processor 514 can eliminate false or "ghost" multi-touch inputs.

Figure 6:
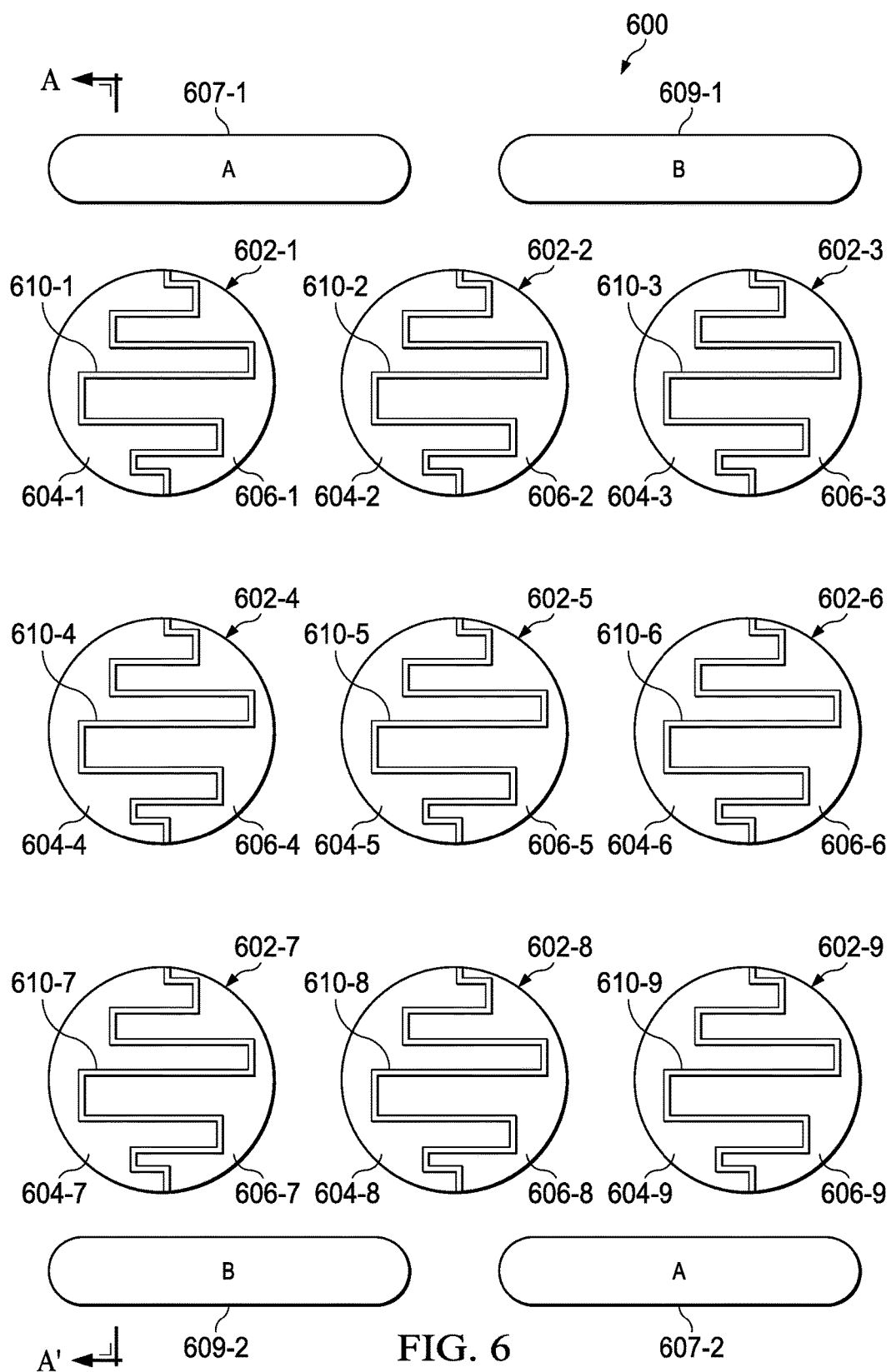
FIG. 6 is a layout diagram of an embodiment circuit board.

FIG. 6 is a layout diagram of an embodiment circuit board 600. Sensors 602-1 through 602-9 are arranged in a three by three matrix as in the embodiment of FIG. 4. Using nine sensors is optional. Any number of sensors may be used. FIG. 6 is a top view of a circuit board. Each sensor 602-X is formed in a copper layer with one side of the sensor 604-X separated from the other side 606-X by a gap 610-X to galvanically separate the sensors. In this embodiment, sensors 602-X are formed in a copper layer. However, other conductive materials may be advantageously used for the formation of sensors 602-X. Electrode 607-1 is on the top left of matrix 600. Electrode 609-1 is on the top right of matrix 600. Electrode 607-2 is opposite the center point of matrix 600 to electrode 607-1 on the bottom right of matrix 600. Electrode 609-2 is opposite the center point of matrix 600 to electrode 609-1 on the bottom left of matrix 600. Electrodes 607-1, 607-2, 609-1 and 609-2 are formed in a copper layer. However, as with sensors 602-X, other conductive materials may be advantageously used for the formation of electrodes 607-1, 607-2, 609-1 and 609-2.

Not shown in FIG. 6 is the sensing circuitry, which can be positioned on the bottom surface of a printed circuit board, or on an adjacent area on the upper surface of the printed circuit board. In another embodiment, the sensing circuitry can be formed on a separate circuit board and coupled to the circuit board of FIG. 6.

Figure 7:
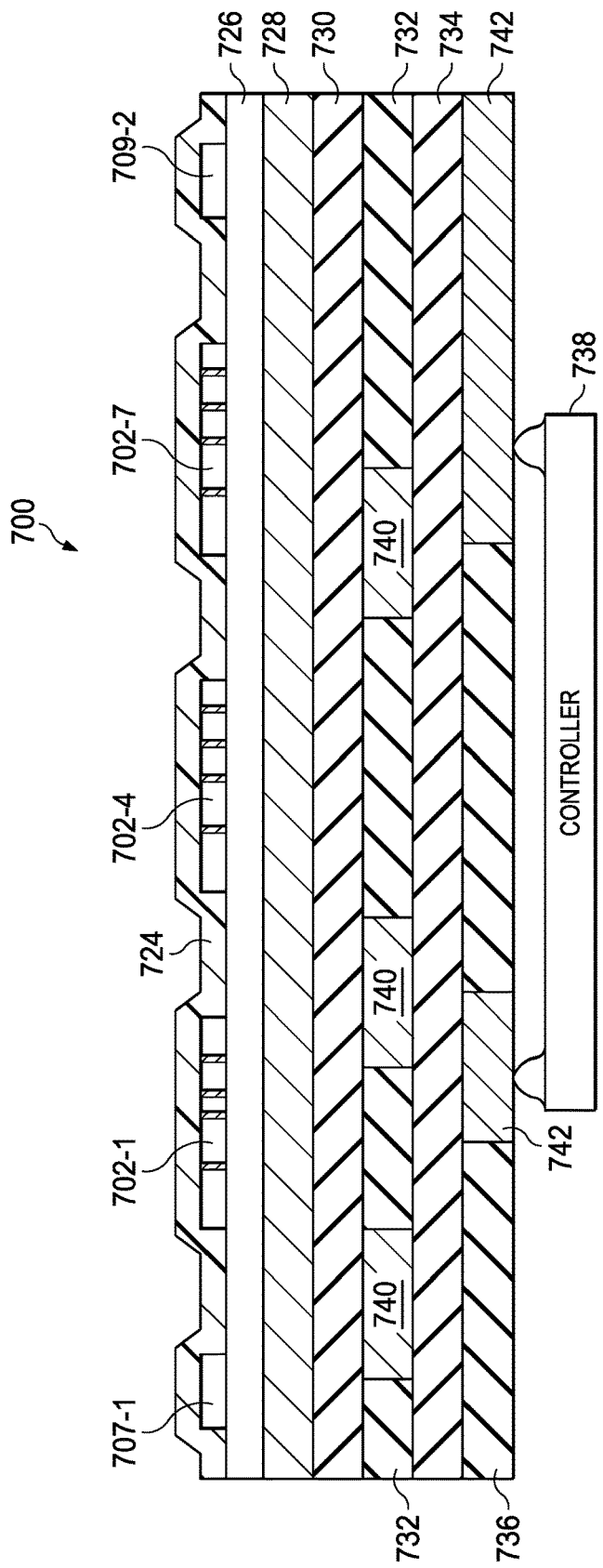
FIG. 7 is a cross-sectional view taken along the line A-A' of FIG. 6.

FIG. 7 is a cross sectional view of an embodiment similar to the embodiment of FIG. 6 along cut line A-A'. Sensors 702-1, 702-4 and 702-7 are on substrate 726 and correspond to sensors 602-1, 602-4 and 602-7 of FIG. 6. Electrodes 707-1 and 709-2 are also on substrate 726 and correspond to electrodes 607-1 and 609-2 of FIG. 6. These sensors and electrodes are formed of a suitable conductive material, such as copper, and formed, in this aspect, by well-known circuit board printing techniques. Cover layer 724 covers sensors 702-1, 702-4, 702-7, electrodes 707-1 and 709-2, as well as the portions of substrate 726 therebetween. In embodiments, cover layer 724 is a plastic material having a thickness of 1 mm or less. In some embodiments, cover layer 724 includes labels for the functions controlled by the sensors on substrate 726. Conductive layer 728 is, in this embodiment, a copper layer and provides shielding for the sensors and electrodes on substrate 726 from signals that may be emitted from the circuitry below conductive layer 728. In the example shown in FIG. 7, layer 728 provides shielding, but also introduces a base capacitance resulting from the electrode 728 and the touch electrodes 702-1 to 702-7 and auxiliary electrodes 707-1 and 709-2. This capacitance is unwanted, as it reduces the sensitivity of the mentioned electrodes. Thus in some alternative embodiment, layer 728 can be moved to lower layers on the printed circuit board, to increase the distance to the electrodes, and thus reduce the capacitance. In a further alternative embodiment layer 728 can be implemented as a hatched copper layer, instead of a solid layer, or both, with the effect of reducing the unwanted capacitance, while still providing the shielding effect towards the traces 740 and 742. Insulating layer 730 separates conductive layer 728 from conductive traces 740. Conductive traces 740 provide interconnections between components in circuit board 720. In some embodiments, more than one layer of traces 740 may be included. Insulator 732 provides insulation between traces 740. Insulating layer 734 separates traces 740 from traces 742 on the bottom surface of circuit board 720. Insulator 736 provides insulation between traces 742. Exposed portions of traces 742 provide contact points for controller 738. Controller 738 may be a number of controllers that can be configured to provide the functionality described hereinabove. An example of such a controller is one of the MSP430 series available integrated circuits commercially from Texas Instruments Incorporated. Vias (not shown) between layers in circuit board 700 provide vertical connections between the components on the upper surface of substrate 726, traces 740 and traces 742.

Figure 8:
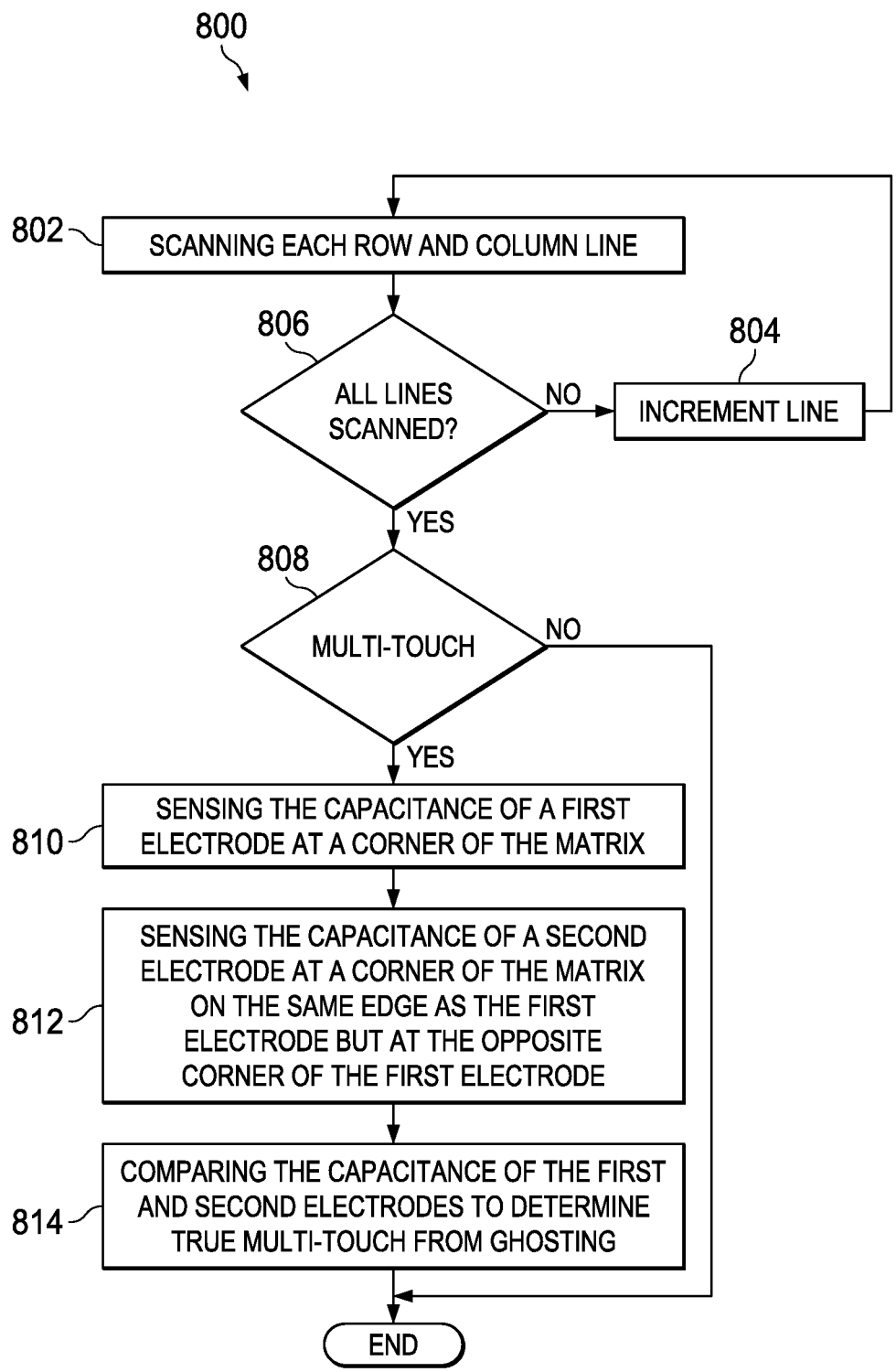
FIG. 8 is a flow diagram of an embodiment method.

FIG. 8 is a flow diagram of an embodiment method 800. The method 800 begins at step 802, where each row and each column line is sensed. Step 806 determines if all lines of the matrix have been scanned. If not, the scan is incremented to the next line in step 804 and step 802 is repeated. If all of the lines have been scanned at step 806, it is determined if a multi-touch was sensed in step 808. If touches were detected to more than one column line or more than one row line, the method continues. If not, the method ends. If a multi-touch was sensed, the capacitance of a first electrode at a corner of the matrix (e.g. electrode 407-1 in FIG. 4) is sensed in step 810. In step 812, the capacitance of a second electrode on the same edge of the matrix as the first electrode but on the opposite corner (e.g. electrode 409-1 in FIG. 4) is sensed. In step 814, the sensed capacitance of the first and second electrodes is compared in order to determine the true multi-touch positions.

Example embodiments provide a low cost capacitive touch sensor and methods that efficiently allows correct detection of multi-touch inputs. Arrangements implemented using the embodiments are low in cost. In some embodiments, use of the multi-touch input to a touch sensor can provide additional input options that a system can respond to, beyond the inputs available using only single touch inputs.

In an example embodiment, a capacitive touch pad includes a plurality of capacitive sensors arranged in a matrix on a substrate. Measuring circuitry is configured to measure the capacitance of each of a plurality of row lines and a plurality of column lines in the matrix coupled to the capacitive sensors. A first electrode is on the substrate on a first edge of the matrix and is proximal to a first corner of the matrix. The first electrode is coupled to the measuring circuitry. A second electrode is on the substrate on the first edge of the matrix and is proximal to a second corner of the matrix. The second corner opposes the first corner on the first edge. The second electrode is coupled to the measuring circuitry.

In another embodiment, the capacitive touch pad includes measuring circuitry configured to compare the capacitance of the first electrode with respect to the capacitive sensors and the capacitance of the second electrode with respect to the capacitive sensors.

In another embodiment, each of the capacitive sensors includes a first plate connected to one of the plurality of row lines, and a second plate connected to one of the plurality of column lines and a gap between the first plate and the second plate.

In yet another embodiment, the capacitive touch pad further includes a third electrode coupled to the first electrode and point symmetrical to the center of the plurality of capacitive sensors from the first electrode and a fourth electrode coupled to the second electrode and point symmetrical to the center of the plurality of capacitive sensors from the second electrode.

In another embodiment, the measuring circuitry is configured to measure capacitance of each of the plurality of capacitive sensors using a relaxation oscillator.

In another embodiment, the plurality of capacitive sensors and the first and second electrodes are formed on a first surface of a printed circuit board and the measuring circuitry is mounted to a second surface of the printed circuit board opposite to the first surface. In an additional embodiment, the measuring circuitry is mounted on the first surface of the printed circuit board but spaced from the plurality of capacitive sensors.

In yet another embodiment, the measuring circuitry is configured to measure the capacitance of the first and second electrodes when a multi-touch to the plurality of capacitive sensors is detected.

In another embodiment, input device includes a plurality of capacitive sensors arranged in a matrix on a substrate, each of the capacitive sensors includes a first plate, a second plate and a gap between the first and second plates. The input device includes a plurality of row leads, each of the plurality of row leads coupled to the first plate of those of the plurality of capacitive sensors on one row of the matrix and a plurality of column leads, each of the plurality of column leads coupled to the second plate of those of the plurality of capacitive sensors on one column of the matrix. Sensing circuitry has a plurality of inputs, each one of the plurality of row leads and the plurality of column leads is coupled to one of the plurality of inputs of the sensing circuitry. A first electrode is on the substrate on a first edge of the matrix and is proximal to a first corner of the matrix. The first electrode is coupled to an input of the sensing circuitry. A second electrode is on the substrate on the first edge of the matrix and is proximal to a second corner of the matrix. The second corner opposes the first corner on the first edge. The second electrode is coupled to the sensing circuitry.

In another embodiment, the sensing circuitry includes a relaxation oscillator.

In yet another embodiment, the input device includes a processor configured to control the timer and configured to determine an action based on the input detected.

In another embodiment, the input device further includes a third electrode coupled to the first electrode and point symmetrical to the center of the plurality of capacitive sensors from the first electrode and a fourth electrode coupled to the second electrode and point symmetrical to the center of the plurality of capacitive sensors from the second electrode.

In another embodiment, the sensing circuitry is configured to measure the capacitance of the first and second electrodes when a multi-touch is detected to the plurality of capacitive sensors.

In yet another embodiment, the plurality of capacitive sensors and the first and second electrodes are formed by patterning a copper layer on the substrate.

In another embodiment, the plurality of capacitive sensors and the first and second electrodes are covered by an insulating layer.

In another embodiment, a method for detecting an input to a plurality of capacitive sensors in a matrix includes scanning each of a plurality of row and column lines in the matrix to detect the capacitance of the row and column lines. The capacitance of a first electrode at a first corner of the matrix relative to the matrix is detected. The capacitance of a second electrode relative to the matrix is also detected. The second electrode is at a second corner of the matrix. The second corner is on a same edge of the matrix as the first corner and opposite to the first corner on the same edge. The correct input to the capacitive sensors is determined by comparing the capacitance of the first and second electrodes.

In yet another embodiment, the method includes detecting the capacitance of a third electrode coupled to the first electrode. The third electrode is point symmetrically positioned relative to the first electrode to the center point of the matrix. The capacitance of a fourth electrode coupled to the second electrode is detected. The fourth electrode is point symmetrically positioned relative to the second electrode to the center point of the matrix. The capacitance of the first and third electrodes is compared to the capacitance of the second and fourth electrodes.

In another embodiment, the capacitance of each of the row and column lines is detected using a relaxation oscillator.

In yet another embodiment, the capacitance of the first and second electrodes is detected using a relaxation oscillator.

In another embodiment, each of the plurality of capacitive sensors includes a first plate on a substrate connected to one row line of the matrix, a second plate on the substrate connected to a column line of the matrix and a gap between the first and second plates.

In another embodiment, the plurality of capacitive sensors is on a printed circuit board.

Modifications are possible in the described embodiments, and other embodiments are possible that are within the scope of the claims.

What is claimed is:
1. A capacitive touch pad, comprising:
a plurality of capacitive sensors arranged in a matrix on a substrate in a plurality of row lines and a plurality of column lines;
a first pair of electrodes, comprising:
 a first electrode at a first corner of the matrix;
 a second electrode coupled to the first electrode, the second electrode at a second corner of the matrix, the second corner opposite the first corner; and
 a first electrode output, wherein the first pair of electrodes is not connected to the plurality of capacitive sensors by traces;
a second pair of electrodes, comprising:
 a third electrode at a third corner of the matrix;
 a fourth electrode coupled to the third electrode, the fourth electrode at a fourth corner of the matrix, the fourth corner opposite the third corner; and a second electrode output, wherein first second of electrodes is not connected to the plurality of capacitive sensors by traces; and a sensing circuit coupled to the plurality of row lines, to the plurality of column lines, to the first electrode output, and to the second electrode output.

2. The capacitive touch pad of claim 1, wherein the sensing circuit is configured to compare a capacitance of the first pair of electrodes with respect to the capacitive sensors and a capacitance of the second pair of electrodes with respect to the capacitive sensors.

3. The capacitive touch pad of claim 1, wherein the capacitive sensors comprise a first plate connected to one of the plurality of row lines, and a second plate connected to one of the plurality of column lines, a gap between the first plate and the second plate.

4. The capacitive touch pad of claim 1, wherein:
the second electrode and the first electrode are point symmetrical to a center of the plurality of capacitive sensors; and
the fourth electrode and the third electrode are point symmetrical to a center of the plurality of capacitive sensors.

5. The capacitive touch pad of claim 1, wherein the sensing circuit is configured to measure capacitance of each of the plurality of capacitive sensors using a relaxation oscillator.

6. The capacitive touch pad of claim 1, wherein the plurality of capacitive sensors, the first electrode, the second electrode, the third electrode, and the fourth electrode are formed on a first surface of a printed circuit board, and the sensing circuit is mounted to a second surface of the printed circuit board opposite to the first surface.

7. The capacitive touch pad of claim 1, wherein the sensing circuit is configured to measure a capacitance of the first pair of electrodes and a capacitance of the second pair of electrodes, in response to detecting a multi-touch to the plurality of capacitive sensors.

8. An input device, comprising:
a plurality of capacitive sensors arranged in a matrix on a substrate, sensors of the capacitive sensors comprising a first plate, a second plate, and a gap between the first and second plates;
a plurality of row leads, leads of the plurality of row leads coupled to the first plate;
a plurality of column leads, leads of the plurality of column leads coupled to the second plate;
a first pair of electrodes, comprising:
a first electrode at a first corner of the matrix;
a second electrode coupled to the first electrode, the second electrode at a second corner of the matrix, the second corner opposite the first corner; and
a first electrode output, wherein the first pair of electrodes is not connected to the plurality of capacitive sensors by traces;
a second pair of electrodes, comprising:
a third electrode at a third corner of the matrix;
a fourth electrode coupled to the third electrode, the fourth electrode at a fourth corner of the matrix, the fourth corner opposite the third corner; and
a second electrode output, wherein the first pair of electrodes is not connected to the plurality of capacitive sensors by traces; and
a sensing circuit coupled to the plurality of row leads, to the plurality of column leads, to the first electrode output, and to the second electrode output.

9. The input device of claim 8, wherein the sensing circuit comprises: a relaxation oscillator, a charge transfer circuit, or a constant current source.

10. The input device of claim 8, wherein the input device comprises a processor coupled to the sensing circuit, the processor configured to:
control the sensing circuit; and
determine an action based on an output of the sensing circuit.

11. The input device of claim 8, wherein:
the second electrode is point symmetrical to the first electrode relative to a center of the matrix; and
the fourth electrode is point symmetrical to the third electrode relative to a center of the matrix.

12. The input device of claim 8, wherein the plurality of capacitive sensors and the first and second electrodes are formed by patterning a copper layer on the substrate.

13. The input device of claim 12, wherein the plurality of capacitive sensors and the first and second electrodes are covered by an insulating layer.

14. A method for multitouch detection, the method comprising:
scanning a plurality of row lines of a plurality of capacitive sensors in a matrix, to detect capacitance of the plurality of row lines;
scanning a plurality of column lines of the plurality of capacitive sensors in the matrix, to detect capacitance of the plurality of column lines;
detecting a capacitance of a first pair of electrodes, the first pair of electrodes comprising a first electrode at a first corner of the matrix and a second electrode at a second corner of the matrix, the second electrode opposite the first corner, wherein the first pair of electrodes is not connected to the plurality of capacitive sensors by traces;
detecting a capacitance of a second pair of electrodes, the first pair of electrodes comprising a third electrode at a third corner of the matrix and a fourth electrode at a fourth corner of the matrix, the fourth corner opposite the third corner, wherein the second pair of electrodes is not connected to the plurality of capacitive sensors by traces; and
detecting a multitouch location based on the capacitance of the plurality of row lines, the capacitance of the plurality of column lines, the capacitance of the first pair of electrodes, and the capacitance of the second pair of electrodes.

15. The method of claim 14 wherein:
the third electrode is symmetrically positioned relative to the fourth electrode to a center point of the matrix; and
the first electrode is symmetrically positioned relative to the second electrode to a center point of the matrix, the method further comprising comparing the capacitance of the first pair of electrodes to the capacitance of the second pair of electrodes.

16. The method of claim 14, wherein detecting the capacitance of the plurality of row lines and detecting the capacitance of the plurality of column lines is performed using a relaxation oscillator, a charge transfer circuit, or a constant current source.

17. The method of claim 14, wherein detecting the capacitance of the first pair of electrodes and detecting the capacitance of the second pair of electrodes are performed using a relaxation oscillator, a charge transfer circuit, or a constant current source.

18. The method of claim 14, wherein sensors of the plurality of capacitive sensors comprise a first plate on a substrate connected to one row line of the matrix, a second plate on the substrate connected to a column line of the matrix, and a gap between the first and second plates.

19. The method of claim 18, wherein the plurality of capacitive sensors is on a printed circuit board.

20. The capacitive touch pad of claim 1, wherein the sensing circuit is configured to measure capacitance of each of the plurality of row lines and capacitance of each of the plurality of column lines.

* * * * *